United States Patent
Xu et al.

(10) Patent No.: US 12,519,425 B2
(45) Date of Patent: Jan. 6, 2026

(54) BROADBAND PASSIVE LOAD MODULATION BALANCE POWER AMPLIFIER

(71) Applicant: Samsung Electronics Co., Ltd., Suwon-si (KR)

(72) Inventors: Xinguang Xu, Allen, TX (US); Gang Xu, Allen, TX (US); Won Suk Choi, McKinney, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 429 days.

(21) Appl. No.: 18/174,518

(22) Filed: Feb. 24, 2023

(65) Prior Publication Data

US 2024/0039477 A1    Feb. 1, 2024

Related U.S. Application Data

(60) Provisional application No. 63/393,611, filed on Jul. 29, 2022.

(51) Int. Cl.
*H03F 1/02* (2006.01)
*H03F 3/21* (2006.01)

(52) U.S. Cl.
CPC ......... *H03F 1/0205* (2013.01); *H03F 3/211* (2013.01); *H03F 2200/192* (2013.01); *H03F 2200/204* (2013.01); *H03F 2200/336* (2013.01); *H03F 2200/423* (2013.01); *H03F 2200/451* (2013.01)

(58) Field of Classification Search
CPC ................. H03F 1/02; H03F 1/07

USPC ............................. 330/124 R, 295
See application file for complete search history.

(56) References Cited

U.S. PATENT DOCUMENTS

| | | | |
|---|---|---|---|
| 6,806,768 B2 * | 10/2004 | Klaren | H03F 3/602 330/51 |
| 8,346,189 B2 | 1/2013 | Dupuy et al. | |
| 11,245,363 B2 | 2/2022 | Bouisse | |
| 2004/0095190 A1 | 5/2004 | Klaren et al. | |
| 2013/0122834 A1 * | 5/2013 | Cabrera | H03F 3/602 455/127.1 |
| 2022/0006428 A1 | 1/2022 | Shepphard et al. | |

FOREIGN PATENT DOCUMENTS

| | | |
|---|---|---|
| CN | 111740703 A | 10/2020 |
| CN | 114172469 A | 3/2022 |

* cited by examiner

*Primary Examiner* — Henry Choe

(57) ABSTRACT

Methods and apparatuses for facilitating wide bandwidth power amplification with high efficiency for analog RF signals. A passive load modulated balanced amplifier (LMBA) device comprises a balanced power amplifier (BPA) and a directional coupler. The BPA comprises a first power amplifier (PA) configured to amplify a first portion of an input power, a second PA configured to amplify a second portion of the input power, an isolation port, and an output port that outputs the amplified first and second portions of the input power as an output power. The directional coupler is configured to provide a portion of the output power from the output port to the isolation port to modulate a load impedance of the first and second PAs.

20 Claims, 8 Drawing Sheets

BROADBAND PASSIVE LOAD MODULATION BALANCE POWER AMPLIFIER

CROSS-REFERENCE TO RELATED APPLICATION AND CLAIM OF PRIORITY

This application claims priority under 35 U.S.C. § 119(e) to U.S. Provisional Patent Application No. 63/393,611 filed on Jul. 29, 2022, which is hereby incorporated by reference in its entirety.

TECHNICAL FIELD

This disclosure relates generally to radio frequency power amplification. Embodiments of this disclosure relate to methods and apparatuses for facilitating wide bandwidth power amplification with high efficiency for analog radio frequency signals.

BACKGROUND

To meet the demand for wireless data traffic having increased since deployment of 4G communication systems and to enable various vertical applications, 5G/NR communication systems have been developed and are currently being deployed. The 5G/NR communication system is considered to be implemented in higher frequency (mmWave) bands, e.g., 28 GHz or 60 GHz bands, so as to accomplish higher data rates or in lower frequency bands, such as 6 GHz, to enable robust coverage and mobility support. Beyond 5G systems, 6G or even later releases which may use terahertz (THz) bands are in development.

High efficiency and broad bandwidth has become more and more important for power amplifier (PA) specification in 5G and 6G telecommunication devices. One typical technology to improve the efficiency of PAs is the Doherty PA which is in wide application in 5G communication systems. One disadvantage that the Doherty PA has is bandwidth limitations.

Another technology, the load modulated balanced power amplifier (LMBA), does not have the inherent bandwidth limitation of the Doherty PA, but the LMBA requires one more PA device and a phase shifter as compared with the Doherty PA, which makes it more costly. Additionally, the efficiency of the LMBA is not improved significantly over the Doherty PA because of the additional PA device.

SUMMARY

Embodiments of the present disclosure provide methods and apparatuses for facilitating wide bandwidth power amplification with high efficiency for analog radio frequency (RF) signals.

In one embodiment, a passive LMBA device is provided, comprising a BPA and a directional coupler. The BPA comprises a first PA configured to amplify a first portion of an input power, a second PA configured to amplify a second portion of the input power, an isolation port, and an output port that outputs the amplified first and second portions of the input power as an output power. The directional coupler is configured to provide a portion of the output power from the output port to the isolation port to modulate a load impedance of the first and second PAs.

In another embodiment, a method performed by a passive LMBA device is provided, comprising the steps of: amplifying, by a first PA of a BPA, a first portion of an input power, amplifying, by a second PA of the BPA, a second portion of the input power, outputting, from an output port of the BPA, the amplified first and second portions of the input power as an output power, and providing, by a directional coupler, a portion of the output power from the output port to an isolation port of the BPA to modulate a load impedance of the first and second PAs.

Other technical features may be readily apparent to one skilled in the art from the following figures, descriptions, and claims.

Before undertaking the DETAILED DESCRIPTION below, it may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system or part thereof that controls at least one operation. Such a controller may be implemented in hardware or a combination of hardware and software and/or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C. As used herein, such terms as "1st" and "2nd," or "first" and "second" may be used to simply distinguish a corresponding component from another and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Embodiments of the present disclosure recognize that LMBAs in theory provide beneficial efficiency enhancements over BPAs without the narrow bandwidth limitations of Doherty PAs. The LMBA accomplishes this by injecting a control power signal (or load impedance modulation signal) to the isolation port of a BPA to modulate the load impedance experienced by the internal balanced PAs of the BPA. However, embodiments of the present disclosure also recognize that in practice it is difficult or impossible to recognize any efficiency gain over a BPA with an LMBA when additional DC power draw of the LMBA (required for a control PA that generates the control power signal) is taken into account. LMBAs requiring this additional control PA may be referred to herein as active LMBAs.

Accordingly, embodiments of the present disclosure provide passive LMBA architectures that reduce or eliminate the need for additional power draw to generate the control power signal (or load impedance modulation signal). For example, embodiments of the present disclosure provide a passive LMBA that couples the output power of a BPA to the output isolation port of the BPA through a passive directional coupler as the load impedance modulation signal. Embodiments of the present disclosure also provide a passive phase shifter to shift the phase of the load impedance modulation signal, further increasing the efficiency gain of the passive LMBA.

Figure 1:
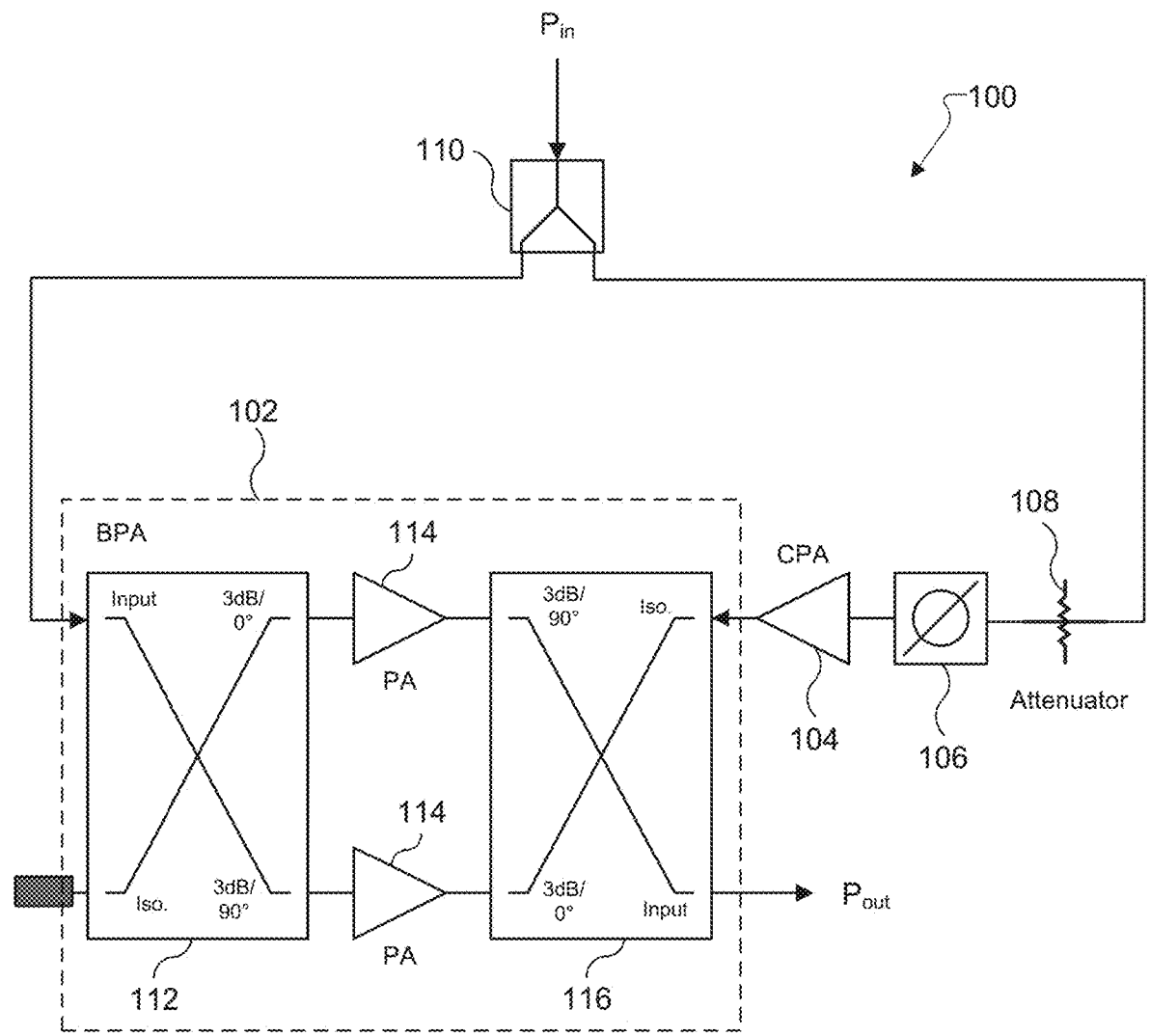
FIG. 1 illustrates an example LMBA according to various embodiments of the present disclosure.

FIG. 1 illustrates an example LMBA 100 according to various embodiments of the present disclosure. The LMBA 100 includes a balanced power amplifier (BPA) 102, a control PA (CPA) 104, a phase shifter 106, an attenuator 108, and a power splitter 110. The BPA 102 is comprised of an input quadrature hybrid coupler 112, two balanced PAs 114, and an output quadrature hybrid coupler 116.

The input power $P_{in}$ may be an RF input. In this embodiment, the RF input power is split at the power splitter 110 and a portion of the RF input power is used to drive the CPA 104. The CPA 104 outputs a control power that is injected into the BPA 102 through the isolation port of the output quadrature hybrid coupler 116 (which may be referred to as the isolation port of the BPA 102). When the output power of the CPA 104 is injected to the isolation port of the BPA 102, the load presented to the balanced PAs 114 becomes a function of the magnitude and phase of the output power of the CPA 104. Accordingly, the output of the CPA 104 that is injected as a control power to the BPA 102 may be referred to as a load impedance modulation signal. The CPA 104 may be operating as a class C PA, and the phase shifter 106 and attenuator 108 can be adjusted to tune the magnitude and phase of the output power of the CPA 104, thereby modulating the load of the BPA 102.

When the output power of the CPA 104 is injected to the BPA 102 through the isolation port to increase the BPA load impedance, the BPA current will be reduced according to the increased load impedance and the output power P out will be increased accordingly. In this manner, the efficiency of the LMBA may be improved over the BPA alone if the CPA DC power consumption is ignored. When the CPA DC power consumption is accounted for, however, the total efficiency of the LMBA is not improved compared with the BPA.

Power efficiency of an amplifier is represented by the ratio of the output power ($P_{out}$) to the DC power consumption ($P_{DC}$) that is required by the amplifiers to obtain that $P_{out}$. For the BPA 102 alone, the efficiency is calculated as:

$$\frac{P_{out}}{P_{DC}} = \frac{2P_{PA}}{2P_{DC\_PA}} \quad (1)$$

where $P_{PA}$ is the output power of one PA 114 and $P_{DC\_PA}$ is the DC power consumed by one PA 114. For the LMBA 100, the efficiency is calculated as:

$$\frac{P_{out}}{P_{DC}} = \frac{2P'_{PA} + P_{CPA}}{2P'_{DC\_PA} + P_{DC\_CPA}} \quad (2)$$

where $P'_{PA}$ is the output power of one PA 114 under load modulation caused by the CPA 104 (characterized by $P'_{PA}=P_{PA}+\Delta P_{LMBA}$), $P'_{DC\_PA}$ is the DC power consumed by one PA 114 under the load modulation (characterized by $P'_{DC\_PA}=P_{DC\_PA}-\Delta P_{DC\_LMBA}$), $D_{CPA}$ is the output power of the CPA 104, and $P_{DC\_CPA}$ is the DC power consumed by the CPA 104. As shown by this equation, the output power of the CPA 104 is added to $P_{out}$. $\Delta P_{LMBA}$ and $\Delta P_{DC\_LMBA}$ vary with the phase of the phase shifter 106. That is, the efficiency of the LMBA 100 depends on the phase of the control power output by the CPA 104.

Figure 2:
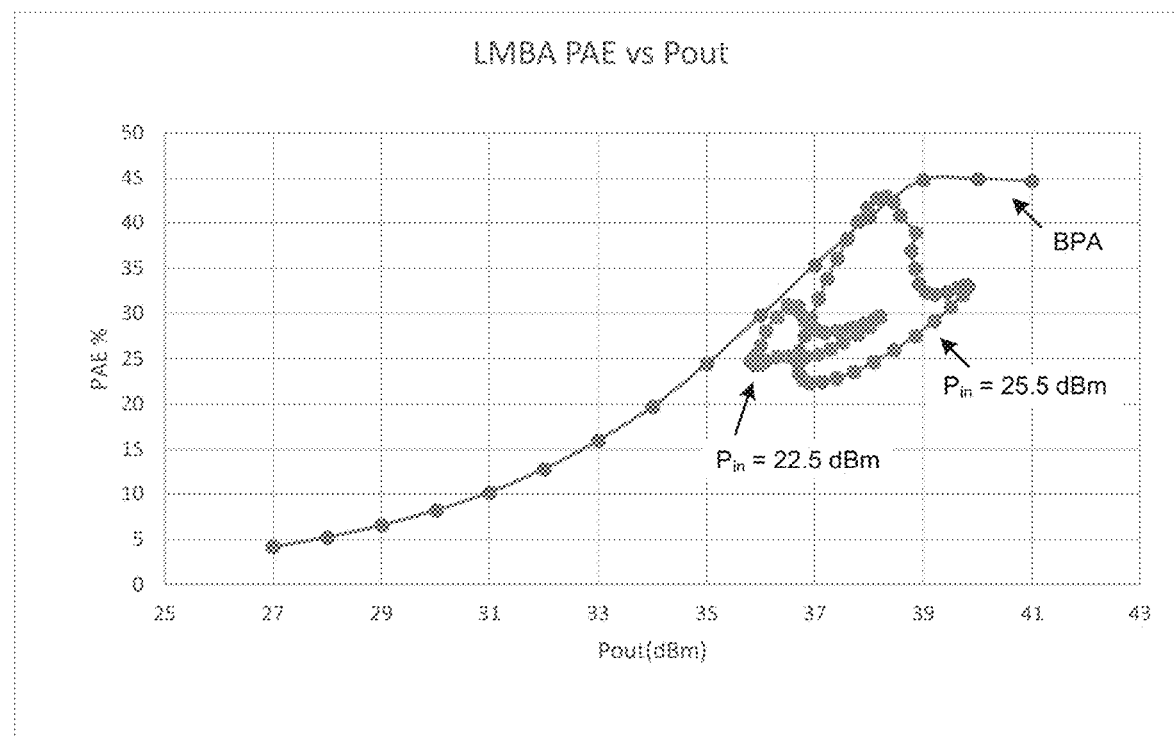
FIG. 2 illustrates an example graph of power-added efficiency (PAE) of an LMBA with varying control power phase according to various embodiments of the present disclosure.

FIG. 2 illustrates an example graph of power-added efficiency (PAE) of an LMBA with varying control power phase according to various embodiments of the present disclosure. The graph of FIG. 2 represents the performance of the example LMBA 100 of FIG. 1. The control power phase in this example refers to the output of the CPA 104, i.e., the input to the output isolation port of the BPA 102.

PAE is a measure of efficiency that accounts for the amplifier gain, calculated as:

$$\frac{P_{out} - P_{in}}{P_{DC}} \quad (3)$$

The efficiency equations (1) and (2) can easily be modified into PAE equations by subtracting $P_{in}$.

FIG. 2 illustrates PAE versus output power $P_{out}$ for the BPA 102 alone, and for the LMBA 100 at two values of $P_{in}$ (22.5 dBm and 25.5 dBm) over one phase rotation of the phase shifter 106 (i.e., the phase φ of the output of the CPA 104 is shifted by an amount varying from 0 to 360 degrees relative to $P_{out}$). In this example, it can be seen that the PAE of the LMBA 100 exceeds the PAE of the BPA 102 only within a small window of phase and only for some $P_{in}$ (such as $P_{in}$=25.5 dBm). For other $P_{in}$ values the LMBA 100 may not be able to exceed the PAE of the BPA 102 at all.

In practice, it is very difficult for the LMBA 100 to exceed the efficiency of the BPA 102 because of the DC power consumption of the CPA 104 (i.e., $P_{DC\_CPA}$). If the CPA DC power consumption is ignored, then the efficiency of the LMBA 100 is higher than that of the BPA 102, however, as illustrated below, the LMBA 100 cannot reach the ideal efficiency at any injected power magnitude and phase from the CPA 104.

According to one embodiment, the CPA may be replaced with a directional coupler that couples output power from the BPA through the output isolation port of the BPA to modulate the load presented to the balanced PAs in the BPA.

Figure 3:
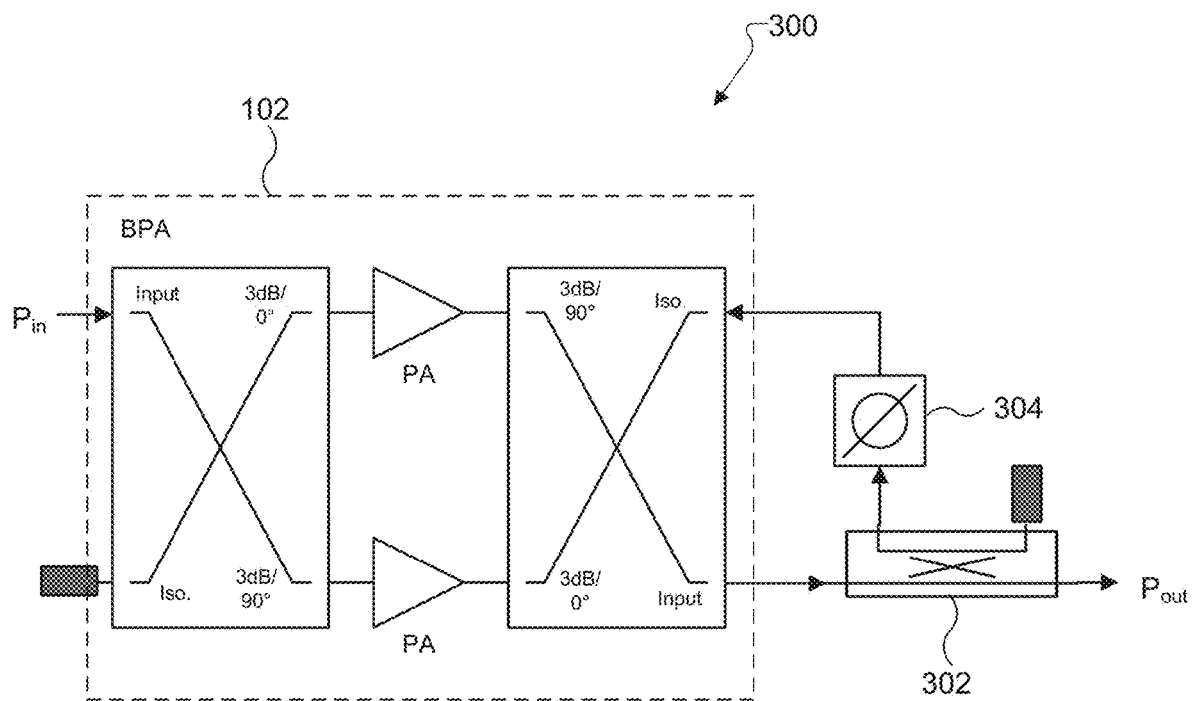
FIG. 3 illustrates an example passive LMBA according to various embodiments of the present disclosure.

FIG. 3 illustrates an example passive LMBA 300 according to various embodiments of the present disclosure. The passive LMBA 300 may include a BPA 102 that is the same as that of the LMBA 100 of FIG. 1. The passive LMBA 300 further includes a directional coupler 302 and a phase shifter 304. The structure of FIG. 3 is defined as a passive LMBA because the removal of the active CPA component (as compared to the LMBA 100) eliminates the additional DC power input P DC CPA required for load modulation of the BPA 102. Instead, the directional coupler 302 passively functions to inject the control power into the BPA 102 to modulate its load impedance.

In one embodiment of FIG. 3, the directional coupler 302 is a 10 dB coupler, and accordingly one tenth of the output power P out of the BPA 102 is coupled through the phase shifter 304 to the output isolation port of the BPA 102 (i.e., to the isolation port of the output quadrature hybrid coupler of the BPA 102). It is understood, however, that other directional couplers could be used, and different amounts of output power may be injected as a control power to output isolation port of the BPA 102.

Figure 4:
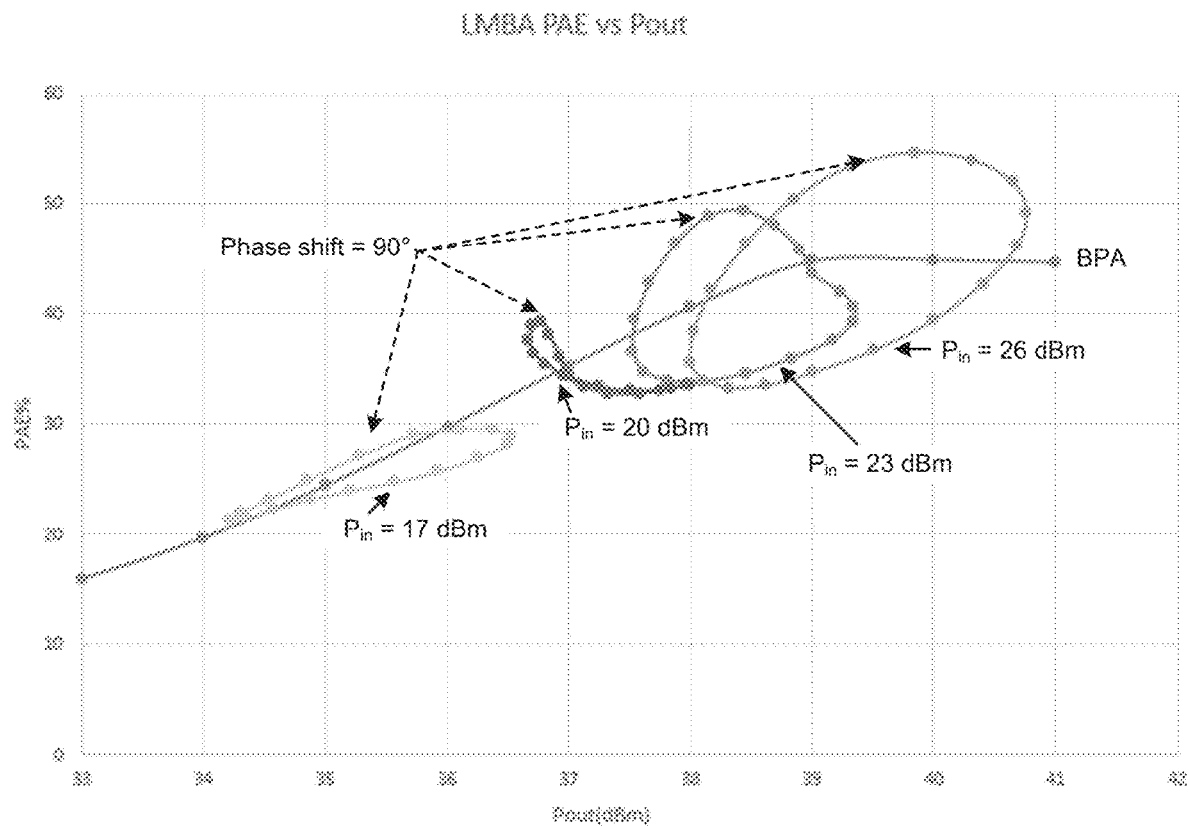
FIG. 4 illustrates an example graph of PAE of a passive LMBA with varying control power phase according to various embodiments of the present disclosure.

FIG. 4 illustrates an example graph of PAE of a passive LMBA with varying control power phase according to various embodiments of the present disclosure. The graph of FIG. 4 represents the performance of the example passive LMBA 300 of FIG. 3. The control power phase in this example refers to the output of the phase shifter 304, i.e., the input to the output isolation port of the BPA 102.

The PAE of the passive LMBA 300 is significantly improved as compared to the LMBA 100. At all of the indicated values of $P_{in}$ the PAE of the passive LMBA 300 exceeds that of the BPA 102 over a large range of phase of the injected control power. In this embodiment, the maximum PAE for the passive LMBA 300 is reached when the phase shift of the phase shifter 304 is 90 degrees (i.e., the phase φ of the output of the phase shifter 304 is shifted 90 degrees relative to $P_{in}$) for a large range of input power P. The passive LMBA 300 may therefore be simplified by replacing the phase shifter 304 with a set 90 degree phase delay.

Figure 5:
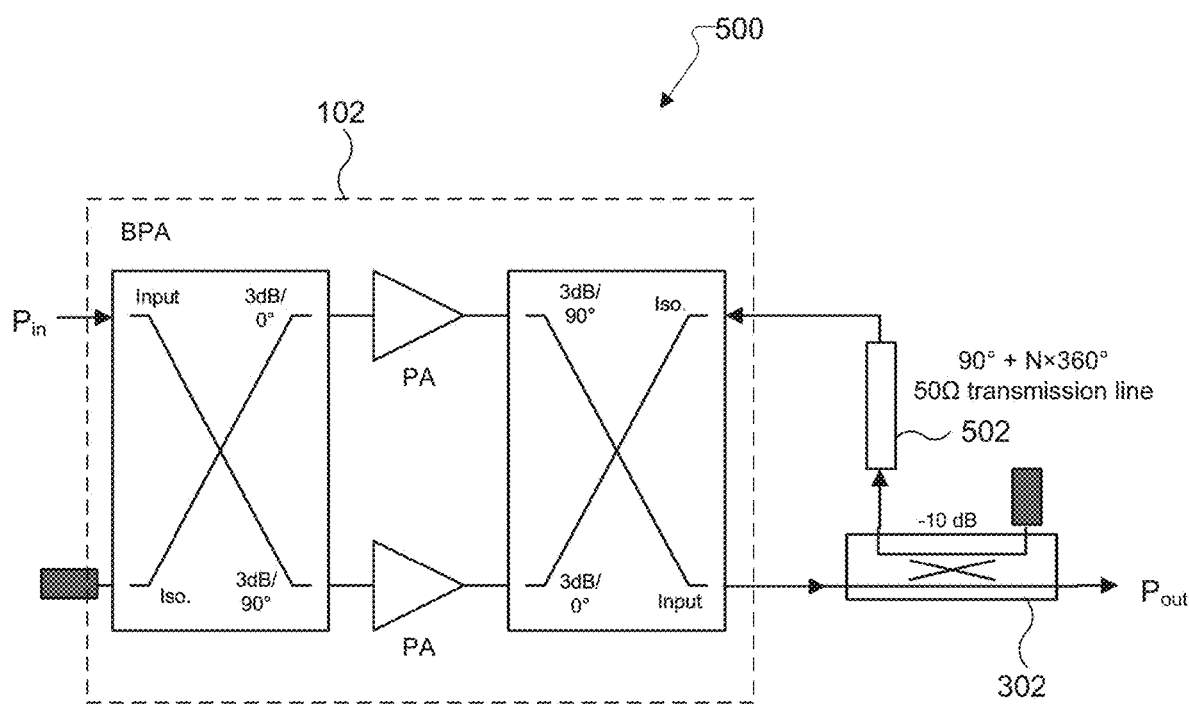
FIG. 5 illustrates another example passive LMBA according to various embodiments of the present disclosure.

FIG. 5 illustrates another example passive LMBA 500 according to various embodiments of the present disclosure. The passive LMBA 500 may include a BPA 102 that is the same as that of the LMBAs 100 and 300, and a directional coupler 302 that is the same as that of the passive LMBA 300. The passive LMBA 500 further includes a static phase delay line 502.

In the example embodiment of FIG. 5, the phase delay line 502 is a 5052 transmission line that has a static quadrature (90 degree) phase delay, e.g., a printed microstrip transmission line on a PCB. It is understood that any multiple of 360 degrees could be added to the phase delay line 502 with the same result. It is also understood that the phase delay line 502 can be considered an abstraction of multiple distinct components that have a combined static phase delay of 90 degrees. For example, an adapter between a transmission line and the directional coupler 302 may contribute some amount of phase delay (e.g., 20 degrees), in which case the transmission line is adjusted to contribute the remainder of the 90 degree phase delay (e.g., 70 degrees). When the phase shift of the phase delay line 502 is added to the phase shift of the output quadrature hybrid coupler of the BPA 102, the total phase shift of the injected control power signal from the output of the BPA 102 to the output isolation port of the BPA 102 is 180 degrees.

Figure 6:
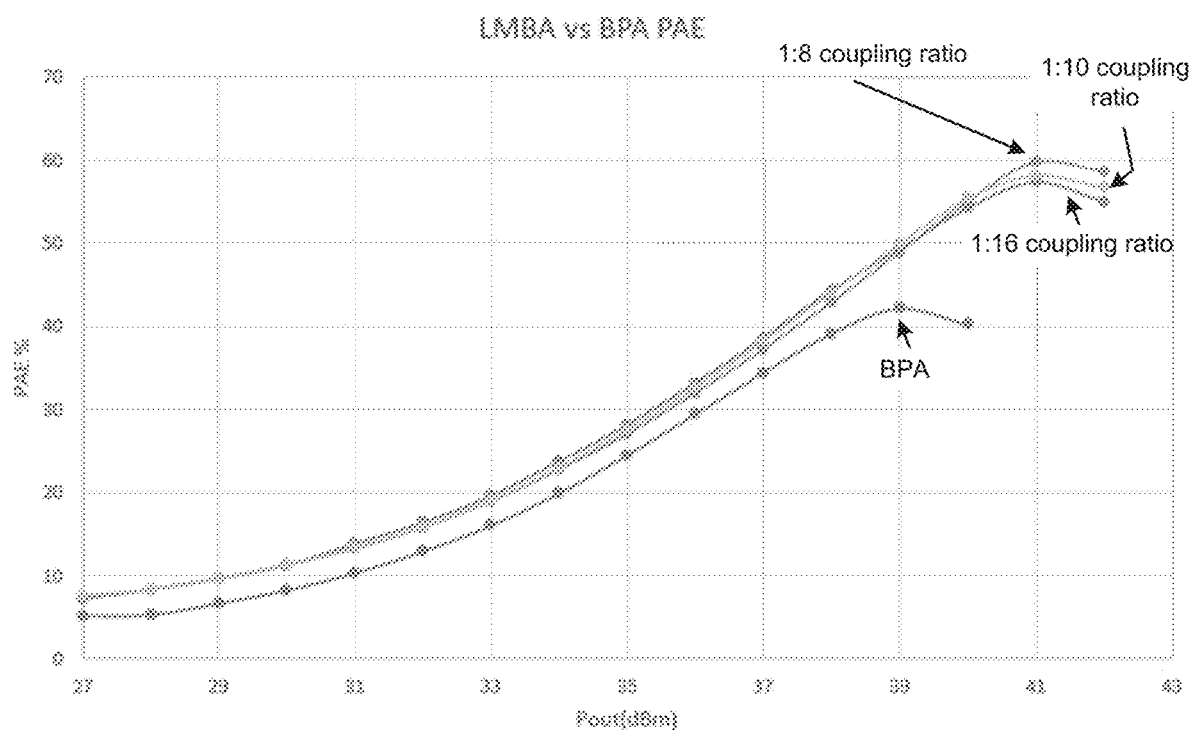
FIG. 6 an example graph of PAE of a passive LMBA with different directional couplers according to various embodiments of the present disclosure.

FIG. 6 an example graph of PAE of a passive LMBA with different directional couplers according to various embodiments of the present disclosure. The graph of FIG. 6 represents the performance of the example passive LMBA 500 of FIG. 5. The control power phase in this example refers to the output of the phase delay line 502, i.e., the input to the output isolation port of the BPA 102. As the phase delay is static in the passive LMBA 500, there is no phase rotation in the graph of FIG. 6.

The graph of FIG. 6 compares the PAE of the BPA 102 to the PAE of the LMBA 500 using a directional coupler 302 having different coupling ratios. For the coupling ratios of 1:8, 1:10, and 1:16 shown in the graph, the LMBA 500 has similar PAE. Likewise, the PAE of the LMBA 500 exceeds the PAE of the BPA 102 by a similar amount (up to 15-18%) with each of these coupler values. Furthermore, the P1dB of the LMBA 500 is increased by 1.5 dB compared with the BPA 102.

The use of a fixed coupler and fixed phase delay line in place of a power splitter, a control PA and a phase shifter changes the LMBA from an active LMBA 100 to a passive LMBA 500. The circuit is greatly simplified, the PA component cost is reduced by 40-60%, and the PCB space also used by the circuit is reduced by 30-50%, while the PA performance metrics such as PAE and P1dB are significantly improved. As compared to the BPA 102, the added cost of the LMBA 500 is minimal.

Additionally, the CPA 104 and the phase shifter 106 of the LMBA 100 introduce additional bandwidth limitations to the LMBA 100. By removing these components in the LMBA 500, the bandwidth of the LMBA is only limited by the components of the BPA 102 and the directional coupler 302 and phase delay line 502, which may be designed to have bandwidths that exceed the BPA 102.

Figure 7:
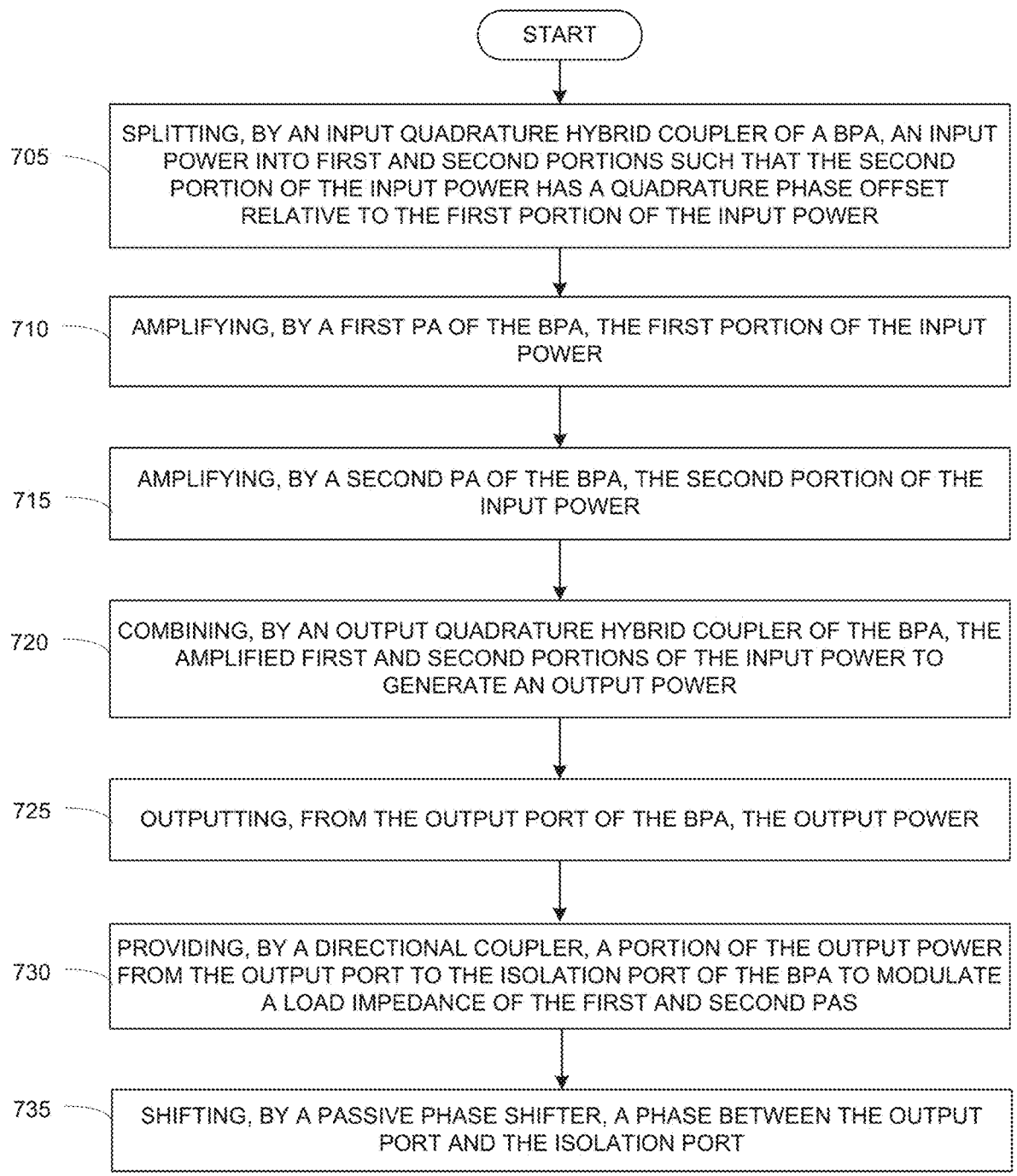
FIG. 7 illustrates an example process of wide bandwidth power amplification with high efficiency for analog RF signals according to various embodiments of the present disclosure.

FIG. 7 illustrates an example process of wide bandwidth power amplification with high efficiency for analog RF signals according to various embodiments of the present disclosure. For convenience the process of FIG. 7 is discussed as being performed by a passive LMBA (such as the LMBA 500 of FIG. 5) comprising a BPA that includes first and second PAs and input and output quadrature hybrid couplers, a directional coupler, and a phase shifter. However, it is understood that any suitable passive LMBA could perform this process.

Referring to FIG. 7, the process begins with splitting, by the input quadrature hybrid coupler of the BPA, an input power into first and second portions of the input power such that the second portion of the input power has a quadrature (90 degree) phase offset relative to the first portion of the input power (step 705).

Next, the first PA of the BPA amplifies the first portion of the input power (step 710) and the second PA of the BPA amplifies the second portion of the input power (step 715). Steps 710 and 715 may occur simultaneously.

The output quadrature hybrid coupler of the BPA then combines the amplified first and second portions of the input power to generate an output power (step 720). The output power has a quadrature (90 degree) phase offset relative to the first portion of the input power. The output quadrature hybrid coupler includes an output port and an isolation port, which may be referred to as the output port and the isolation port of the BPA.

The output port of the BPA (i.e., the output port of the output quadrature hybrid coupler) then outputs the output power (step 725).

Next, the directional coupler provides a portion of the output power from the output port to the isolation port of the BPA (i.e., the isolation port of the output quadrature hybrid coupler) to modulate a load impedance of the first and second PAs (step 730). This may be referred to as providing a load impedance modulation signal from the output port to the isolation port. A PAE of the BPA is increased by the modulation of the load impedance of the first and second PAs caused by providing the portion of the output power from the output port of the output quadrature hybrid coupler to the isolation port of the output quadrature hybrid coupler.

Finally, the passive phase shifter shifts a phase (e.g., of the load impedance modulation signal) between the output port and the isolation port (step 735). The passive phase shifter may be a fixed delay line, and shifting the phase between the output port and the isolation port in this case comprises producing, by the fixed delay line, a quadrature (90 degree) phase delay between the directional coupler and the isolation port.

The input quadrature hybrid coupler has a first bandwidth and the output quadrature hybrid coupler has a second bandwidth, and a bandwidth of the LMB A is equivalent to the narrower of the first and second bandwidths. When the input quadrature hybrid coupler and the output quadrature hybrid coupler have a same first bandwidth, a bandwidth of the LMBA is equivalent to the first bandwidth.

The above flowchart illustrates an example method or process that can be implemented in accordance with the principles of the present disclosure and various changes could be made to the methods or processes illustrated in the flowcharts. For example, while shown as a series of steps, various steps could overlap, occur in parallel, occur in a different order, or occur multiple times. In another example, steps may be omitted or replaced by other steps.

Figure 8:
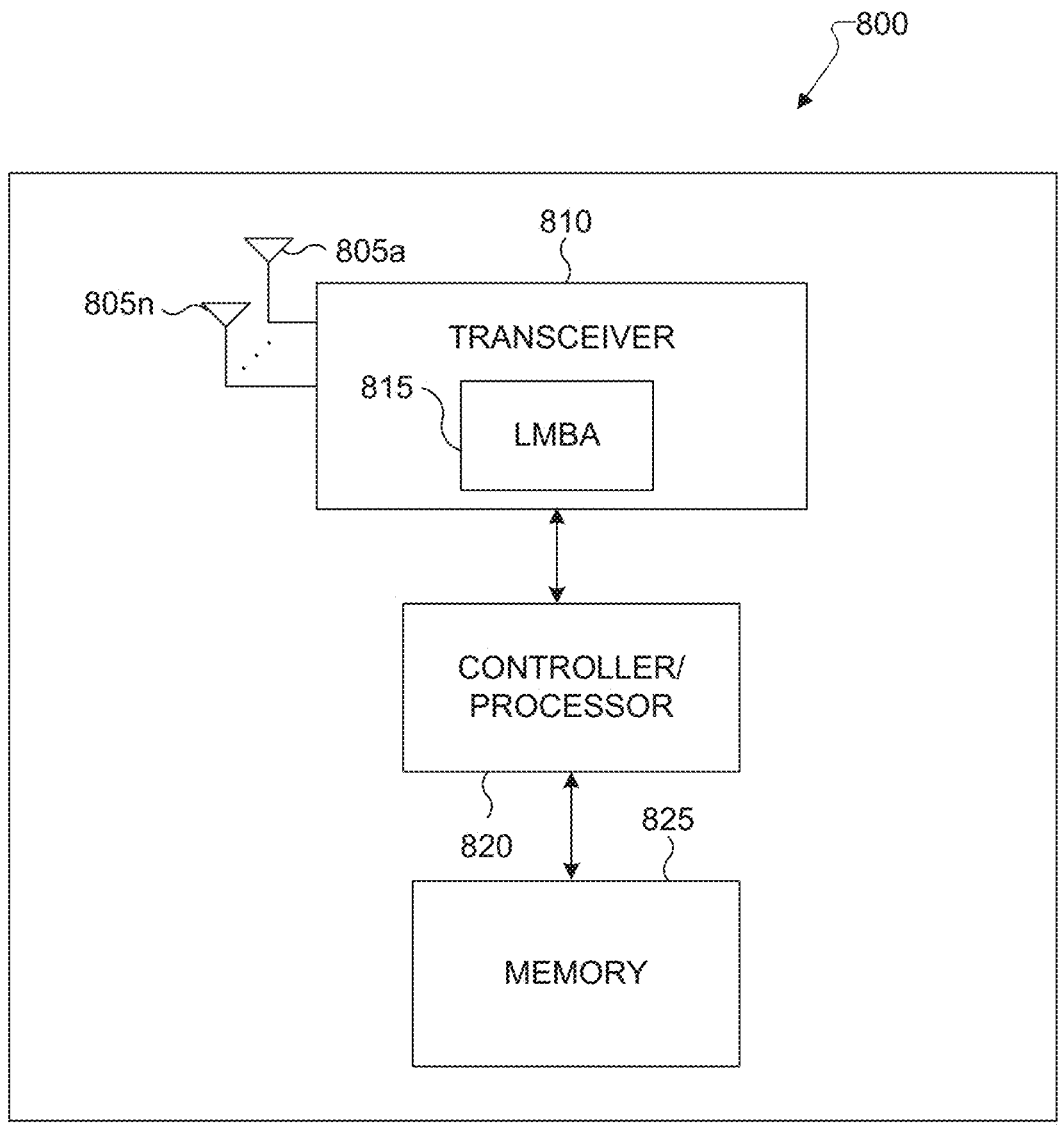
FIG. 8 illustrates an example wireless device according to embodiments of the present disclosure.

FIG. 8 illustrates an example wireless device 800 according to embodiments of the present disclosure. The wireless device 800 could be, for example, a base station (BS) such as a gNodeB (gNB), a wireless access point (AP), a user equipment (UE), a terminal, or the like. However, wireless devices come in a wide variety of configurations, and FIG. 8 does not limit the scope of this disclosure to any particular implementation of a wireless device.

As shown in FIG. 8, the wireless device 800 includes multiple antennas 805*a*-805*n*, a transceiver 810, a controller/processor 820, and a memory 825. The transceiver 810 also includes at least one LMBA 815.

The transceiver 810 receives, from the antennas 805*a*-805*n*, incoming RF signals, such as signals transmitted by other wireless devices in a network. The transceiver 810 down-converts the incoming RF signals to generate IF or baseband signals. The IF or baseband signals are processed by receive (RX) processing circuitry in the transceiver 810 and/or controller/processor 820, which generates processed baseband signals by filtering, decoding, and/or digitizing the baseband or IF signals. The controller/processor 820 may further process the baseband signals.

Transmit (TX) processing circuitry in the transceiver 810 and/or controller/processor 820 receives analog or digital data (such as voice data, web data, e-mail, or interactive video game data) from the controller/processor 820. The TX processing circuitry encodes, multiplexes, and/or digitizes the outgoing baseband data to generate processed baseband or IF signals. The transceiver 810 up-converts the baseband or IF signals to RF signals that are amplified using the LMBA 815 for transmission via the antennas 805*a*-805*n*.

The controller/processor 820 can include one or more processors or other processing devices that control the overall operation of the wireless device 800. For example, the controller/processor 820 could control the reception of UL channel signals and the transmission of DL channel signals by the transceiver 810 in accordance with well-known principles. The controller/processor 820 could support additional functions as well, such as more advanced wireless communication functions. For instance, the controller/processor 820 could support beam forming or directional routing operations in which outgoing/incoming signals from/to multiple antennas 805*a*-805*n* are weighted differently to effectively steer the outgoing signals in a desired direction. Any of a wide variety of other functions could be supported in the wireless device 800 by the controller/processor 820.

The controller/processor 820 is also capable of executing programs and other processes resident in the memory 825, such as an OS. The controller/processor 820 can move data into or out of the memory 825 as required by an executing process.

The memory 825 is coupled to the controller/processor 820. Part of the memory 825 could include a RAM, and another part of the memory 825 could include a Flash memory or other ROM.

Although FIG. 8 illustrates one example of a wireless device 800, various changes may be made to FIG. 8. For example, the wireless device 800 could include any number of each component shown in FIG. 8. Also, various components in FIG. 8 could be combined, further subdivided, or omitted and additional components could be added according to particular needs. For example, the wireless device 800 may be strictly a transmitter, and all receiver components may be omitted. Alternatively, the wireless device 800 could include additional components to allow it to communicate with other devices or systems over a backhaul connection or over another wireless network.

Although the present disclosure has been described with an exemplary embodiment, various changes and modifications may be suggested to one skilled in the art. It is intended that the present disclosure encompass such changes and modifications as fall within the scope of the appended claims. None of the description in this application should be read as implying that any particular element, step, or function is an essential element that must be included in the claims scope. The scope of patented subject matter is defined by the claims.

What is claimed is:

1. A passive load modulated balanced amplifier (LMBA) device, comprising:
a balanced power amplifier (BPA) that comprises:
a first power amplifier (PA) configured to amplify a first portion of an input power,
a second PA configured to amplify a second portion of the input power,
an isolation port, and
an output port that outputs the amplified first and second portions of the input power as an output power;
a directional coupler configured to provide a portion of the output power from the output port to the isolation port to modulate a load impedance of the first and second PAs; and
a passive phase shifter configured to shift a phase between the output port and the isolation port.

2. The passive LMBA device of claim 1, wherein:
the passive phase shifter is a fixed delay line that is configured to produce a quadrature phase delay between the directional coupler and the isolation port.

3. The passive LMBA device of claim 1, wherein:
the directional coupler is configured to provide a load impedance modulation signal from the output port to the isolation port.

4. The passive LMBA device of claim 1, wherein:
the BPA further comprises an input quadrature hybrid coupler configured to split the input power into the first and second portions of the input power such that the second portion of the input power has a quadrature phase offset relative to the first portion of the input power.

5. The passive LMBA device of claim 4, wherein:
the BPA further comprises an output quadrature hybrid coupler that includes the output port and the isolation port, and the output quadrature hybrid coupler is configured to combine the amplified first and second portions of the input power to generate the output power.

6. The passive LMBA device of claim 5, wherein:
a power added efficiency (PAE) of the BPA is increased by the modulation of the load impedance of the first and second PAs caused by providing the portion of the output power from the output port of the output quadrature hybrid coupler to the isolation port of the output quadrature hybrid coupler.

7. The passive LMBA device of claim 5, wherein:
the input quadrature hybrid coupler has a first bandwidth and the output quadrature hybrid coupler has a second bandwidth, and
a bandwidth of the LMBA is equivalent to the narrower of the first and second bandwidths.

8. The passive LMBA device of claim 5, wherein:
the input quadrature hybrid coupler and the output quadrature hybrid coupler have a same first bandwidth, and
a bandwidth of the LMBA is equivalent to the first bandwidth.

9. The passive LMBA device of claim 1, wherein:
the second portion of the input power and the output power have a 90 degree phase offset relative to the first portion of the input power.

10. A method performed by a passive load modulated balanced amplifier (LMBA) device, the method comprising:
amplifying, by a first power amplifier (PA) of a balanced power amplifier (BPA), a first portion of an input power;
amplifying, by a second PA of the BPA, a second portion of the input power;
outputting, from an output port of the BPA, the amplified first and second portions of the input power as an output power;
providing, by a directional coupler, a portion of the output power from the output port to an isolation port of the BPA to modulate a load impedance of the first and second PAs; and
shifting, by a passive phase shifter, a phase between the output port and the isolation port.

11. The method of claim 10, wherein:
the passive phase shifter is a fixed delay line, and
shifting the phase between the output port and the isolation port comprises producing, by the fixed delay line, a quadrature phase delay between the directional coupler and the isolation port.

12. The method of claim 10, further comprising:
providing, by the directional coupler, a load impedance modulation signal from the output port to the isolation port.

13. The method of claim 10, further comprising:
splitting, by an input quadrature hybrid coupler of the BPA, the input power into the first and second portions of the input power such that the second portion of the input power has a quadrature phase offset relative to the first portion of the input power.

14. The method of claim 13, further comprising:
combining, by an output quadrature hybrid coupler of the BPA, the amplified first and second portions of the input power to generate the output power,
wherein the output quadrature hybrid coupler includes the output port and the isolation port.

15. The method of claim 14, wherein:
a power added efficiency (PAE) of the BPA is increased by the modulation of the load impedance of the first and second PAs caused by providing the portion of the output power from the output port of the output quadrature hybrid coupler to the isolation port of the output quadrature hybrid coupler.

16. The method of claim 14, wherein:

the input quadrature hybrid coupler has a first bandwidth and the output quadrature hybrid coupler has a second bandwidth, and a bandwidth of the LMBA is equivalent to the narrower of the first and second bandwidths.

17. The method of claim 14, wherein:

the input quadrature hybrid coupler and the output quadrature hybrid coupler have a same first bandwidth, and a bandwidth of the LMBA is equivalent to the first bandwidth.

18. The method of claim 10, wherein:

the second portion of the input power and the output power have a 90 degree phase offset relative to the first portion of the input power.

19. The passive LMBA device of claim 1, wherein the passive phase shifter is coupled to an output quadrature hybrid coupler of the BPA.

20. The method of claim 10, wherein the passive phase shifter is coupled to an output quadrature hybrid coupler of the BPA.

* * * * *